(12) United States Patent
Kim et al.

(10) Patent No.: US 6,897,385 B2
(45) Date of Patent: May 24, 2005

(54) SEMICONDUCTOR TEST BOARD FOR FINE BALL PITCH BALL GRID ARRAY PACKAGE

(75) Inventors: Jang-ryeul Kim, Suwon (KR); Woo-seong Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 10/225,680

(22) Filed: Aug. 22, 2002

(65) Prior Publication Data

US 2003/0141886 A1 Jul. 31, 2003

(30) Foreign Application Priority Data

Jan. 30, 2002 (KR) .......................................... 2002-5418

(51) Int. Cl.⁷ .......................... H01R 12/04; G01R 31/02
(52) U.S. Cl. .................... 174/262; 324/755; 324/158.1; 439/60
(58) Field of Search ................................ 361/777–779, 361/760–761, 773–774, 742; 174/255, 262–266; 439/60, 75; 324/755, 158

(56) References Cited

U.S. PATENT DOCUMENTS

| | | | | |
|---|---|---|---|---|
| 5,888,627 A | * | 3/1999 | Nakatani | 428/209 |
| 5,967,804 A | * | 10/1999 | Yoshizawa et al. | 439/91 |
| 6,271,483 B1 | * | 8/2001 | Horiuchi et al. | 174/265 |
| 6,459,039 B1 | * | 10/2002 | Bezama et al. | 174/52.4 |
| 6,580,035 B1 | * | 6/2003 | Chung | 174/255 |

FOREIGN PATENT DOCUMENTS

JP 11-284107 10/1999 .......... H01L/23/32

* cited by examiner

Primary Examiner—Kamand Cuneo
Assistant Examiner—Paresh Patel
(74) Attorney, Agent, or Firm—Mills & Onello LLP

(57) ABSTRACT

A semiconductor package test board for conveniently testing a fine ball pitch ball grid array package is provided. The provided semiconductor package test board includes a socket contact unit formed of a plurality of layers, to which a socket having the semiconductor package is connected, wherein the pitch between holes to which pins of the socket are connected increases from the upper surface to the lower surface in the socket contact unit. The holes in the socket contact unit are inclined toward the edges of the socket contact unit, and the angle of inclination of the holes increases from the center of the socket contact unit to the edges of the socket contact unit. Therefore, the holes are formed such that the ball pitch increases from the top layer to the bottom layer. As a result, the socket having the semiconductor package can be directly mounted on the test board without additionally mounting the sub test board (the socket board). In addition, the holes are formed perpendicular to each layer of the socket contact unit, to connect the holes to those on the layers above by using a conductor. As a result, problems such as deterioration of characteristics caused by contact error can be solved.

8 Claims, 5 Drawing Sheets

SEMICONDUCTOR TEST BOARD FOR FINE BALL PITCH BALL GRID ARRAY PACKAGE

BACKGROUND OF THE INVENTION

1. Field of the Invention

The present invention relates to a semiconductor test board, and more particularly, to a semiconductor test board for a fine pitch ball grid array package.

2. Description of the Related Art

With increases in the function, integration, and number of pins of semiconductor devices, it becomes more important to use an excellent test board with improved characteristics, which can test the device under optimum conditions.

Types of packages include a quad flat package (QFP), dual in-line package (DIP), plastic leaded chip carrier (PLCC), and ball grid array (BGA). Especially for the BGA, the number of pins increases while the size of the test board decreases. However, technology for producing test hardware for testing the package is far behind this increase in pin quantity and reduction in size.

A light weight fine ball grid array (FBGA) package, having a plurality of pins, is a leading semiconductor chip. However, there is a limit in producing a test board for the FBGA package using conventional producing technology. Accordingly, when the distance between balls, namely the ball pitch, is under a predetermined value, it is impossible to directly draw a pattern on the test board for supplying current to holes which are connected to the balls. This is because the ball pitch is small so that it is difficult to form the pattern in a non-contact state with the holes.

As a result, a sub test board or a socket board is added on a main test board in the conventional test board for the FBGA package for solving the problem of the direct drawing.

However, the sub test board causes several difficulties. Since a test socket on which the semiconductor package is mounted cannot be directly connected to the main test board, incomplete contact may occur at the contact points between the sub test board and main test board. In addition, resistance values increase, causing problems in a high speed test and an analog test.

FIG. 1 is a sectional view illustrating a conventional test board for a semiconductor memory.

A test board 100 is an apparatus for interfacing between a test system (not shown), which tests electric characteristics of semiconductor packages, and a semiconductor package 150 to be tested.

Referring to FIG. 1, the test board 100 is formed of a performance board 110 on which a guide panel 120 is mounted and supported by supporters 115. In this case, the performance board 110 is inserted into the test system, and a device under test (DUT) board 130 is inserted into the guide panel 120. The corresponding semiconductor package 150 is connected to the DUT board 130 through a socket 140. In this case, it is preferable that means other than the socket 140 connect the DUT board 130 and the semiconductor package 150.

Since the performance board 110 and the DUT board 130 are connected through cables 125, electric signals for testing the semiconductor package 150 are transferred from the performance board 110 to the DUT board 130 through the cables 125. The electric signals transferred to the DUT board 130 are input to the semiconductor package 150 through the socket 140.

FIG. 2 is a top plan view illustrating the test board of FIG. 1.

Referring to FIG. 2, the DUT board 130 is placed on the performance board 110 of a test board 200. The DUT board 130 is formed of a socket contact unit 210 and a channel region 220. In this case, the socket (not shown) on which the semiconductor package (not shown) is mounted is connected to the DUT board 130 made of a plurality of joined layers (not shown). The channel region 220 has channels to which pogo pins are connected for transferring the electric signals for testing the package.

Holes on the socket contact unit 210 are connected to the channels CH1, CH2, CH3, and CH 4 of the channel region 220 through pattern lines PLINE1, PLINE2, PLINE3, and PLINE4 that perform as electric passages. In this case, the socket contact unit 210 is connected to the pins of the socket on which the semiconductor package is mounted.

When the socket having the semiconductor package is connected in the conventional test board 200, the pins of the socket are directly connected to the upper surface of the socket contact unit 210 of the test board 200.

The holes are formed from the upper surface of the socket contact unit 210 to the bottom of the socket contact unit 210, namely a last layer, by passing through all the layers. The pattern lines PLINE1, PLINE2, PLINE3, and PLINE4 are formed on each layer for connecting the holes to the channels at the edges of the DUT board 130. That is, the first pattern line PLINE1 is formed on the top layer of the socket contact unit 210 for connecting one hole to the first channel CH1, and the second pattern line PLINE2 is formed on a second layer of the socket contact unit 210 for connecting another hole to the second channel CH2. In the same manner, the third and fourth pattern lines PLINE3 and PLINE4 are formed on third and fourth layers for connecting holes to the third and fourth channels CH3 and CH4.

In this case, the distance between the holes, namely the ball pitch, on the top layer of the socket contact unit 210 is the same as on the bottom layer, in the conventional test board 200.

It is a trend that the ball pitch becomes smaller. When the socket contact unit 210 of the test board 200 has the ball pitch of less than a predetermined size, for example about 0.65 mm, it is difficult to directly draw the pattern lines on the layers of the socket contact unit 210 and to produce the test board 200. Therefore, a sub test board is produced for mounting the socket, and the sub test board having the socket is mounted on the test board, thereby separately mounting the socket.

FIG. 3 is an enlarged view of a portion of the socket contact unit shown in FIG. 2.

FIG. 3 illustrates a socket contact unit having a ball pitch BP of 0.65 mm. In contrast to a practical board, the test board has the socket contact unit, which is formed by coupling more than six layers. Accordingly, the sizes of the holes on the socket contact unit of the test board become gradually smaller, making it difficult to form the pattern lines for connecting the holes in the socket contact unit to the channels outside of the socket contact unit.

SUMMARY OF THE INVENTION

To solve the above-described problems, it is an objective of the present invention to produce slanted holes, to maintain the ball pitch at the point of connection between the upper surface of the socket contact unit and the socket while gradually increasing the ball pitch towards the lower layers in the socket contact unit.

As a result, the socket having the semiconductor package can be directly mounted on the test board without additionally mounting the sub test board (the socket board).

It is second objective of the present invention to form perpendicular holes on each layer of the socket contact unit, to connect the holes to those on the layer above by using a conductor. Accordingly, problems such as deterioration of characteristics caused by contact error can be solved.

To solve the above-described problems, it is an objective of the present invention to provide a semiconductor test board for a fine pitch ball grid array package.

A semiconductor package test board according to an embodiment of the present invention comprises a socket contact unit formed of a plurality of layers, to which a socket having the semiconductor package is connected, wherein the pitch between holes to which pins of the socket are connected increases from the upper surface to the lower surface in the socket contact unit. In accordance with an embodiment of the invention, the semiconductor package test board can be used for testing driving capacity by supplying a test voltage to the semiconductor package.

In one embodiment, the holes in the socket contact unit are inclined toward the edges of the socket contact unit, and the angle of inclination of the holes increases from the center of the socket contact unit to the edges of the socket contact unit.

It is preferable that the socket contact unit have the holes filled with a conductor, and the semiconductor package is a fine ball grid array (FBGA).

The semiconductor package test board according to an embodiment of the present invention comprises the socket contact unit formed of first through nth joined layers, to which the socket having the semiconductor package is connected, wherein the pitch between the holes to which the pins of the socket are connected increases from the first to the nth layers.

The first through nth layers have the holes which are inclined toward the edges of the layers, and the angle of inclination of the holes increases from the center of the layers to the edges of the layers.

It is preferable that the holes in the first through nth layers be filled with the conductor, and the semiconductor package is the FBGA.

A semiconductor package test board according to a second embodiment of the present invention comprises a socket contact unit formed of a plurality of joined layers, to which a socket having the semiconductor package is connected, wherein the pitch between holes to which pins of the socket are connected increases from the upper surface to the lower surface, and contact patterns are formed on the upper surfaces of the holes in the layers which compose the socket contact unit, except for the top layer, so that portions of the contact patterns on each layer overlap portions of the holes on the layer above, in the socket contact unit. In accordance with an embodiment of the invention, the semiconductor package test board can be used for testing driving capacity by supplying a test voltage to the semiconductor package.

The holes formed in each layer of the socket contact unit are formed perpendicular to that layer, and the pitch of the holes increases from the upper surface to the lower surface of the socket contact unit.

It is preferable that the holes of the socket contact unit be filled with a conductor, and the semiconductor package is an FBGA.

The semiconductor package test board according to the second embodiment of the present invention comprises the socket contact unit formed of first through nth joined layers, to which the socket having the semiconductor package is connected, wherein the pitch between the holes to which the pins of the socket are connected increases from the first to the nth layers, and the contact patterns are formed on the upper surfaces of the holes in the second through nth layers, so that portions of the contact patterns on each layer overlap portions of the holes in the layer above.

The holes formed in each of the first through nth layers are formed perpendicular to that layer, and the pitch of the holes increases from the first to the nth layers.

It is preferable that the holes in the first through nth layers are filled with the conductor, and the semiconductor package is the FBGA.

Therefore, the holes are formed such that the ball pitch increases from the top layer to the bottom layer. As a result, the socket having the semiconductor package can be directly mounted on the test board without additionally mounting the sub test board (the socket board). In addition, the holes are formed perpendicular on each layer of the socket contact unit, for connecting the holes to those on the layer above by using the conductor. As a result, problems such as deterioration of characteristics caused by contact error can be solved.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
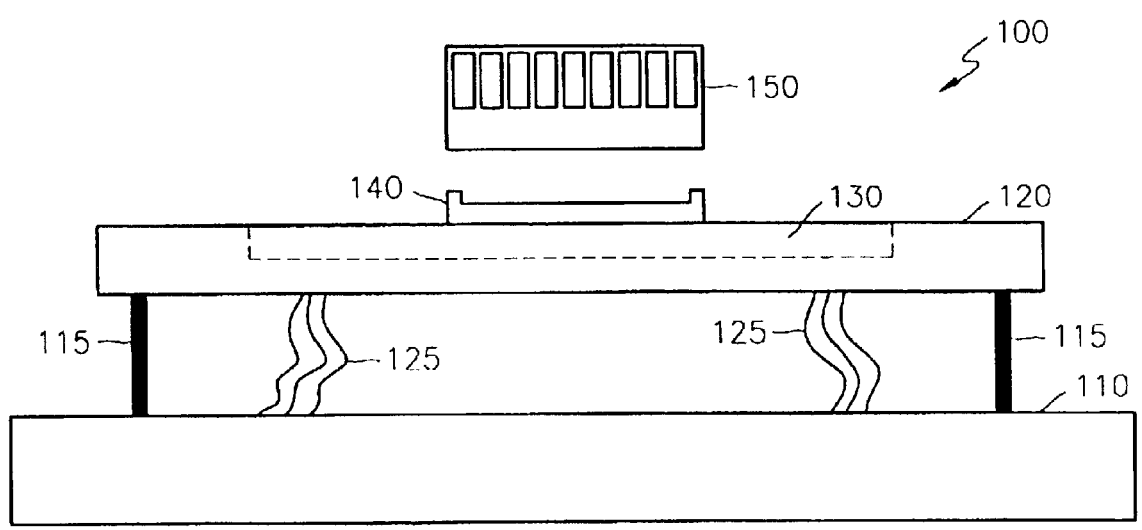
FIG. 1 is a sectional view illustrating a conventional test board for a semiconductor memory package.
Figure 2:
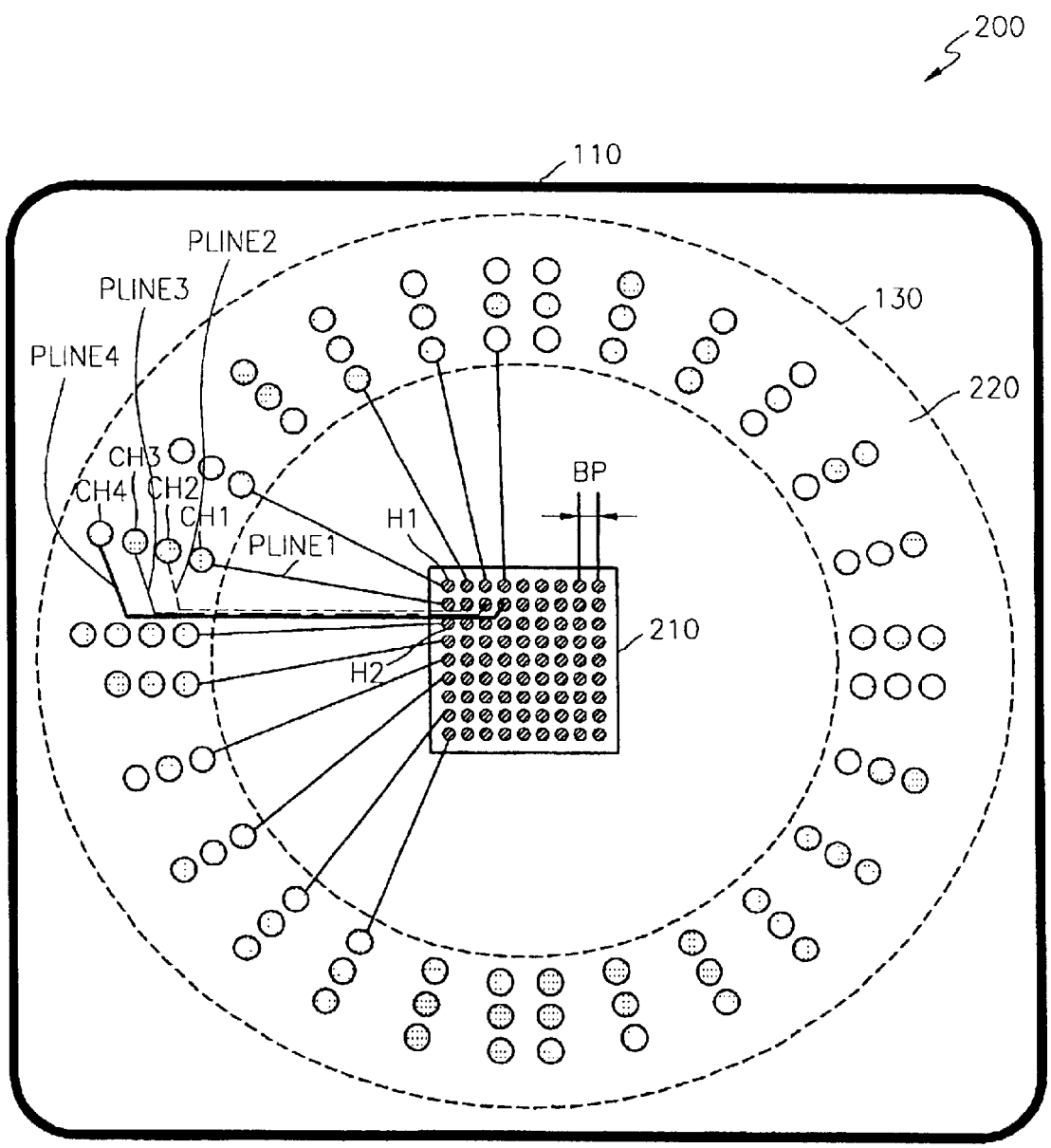
FIG. 2 is a top plan view illustrating the test board of FIG. 1.
Figure 3:
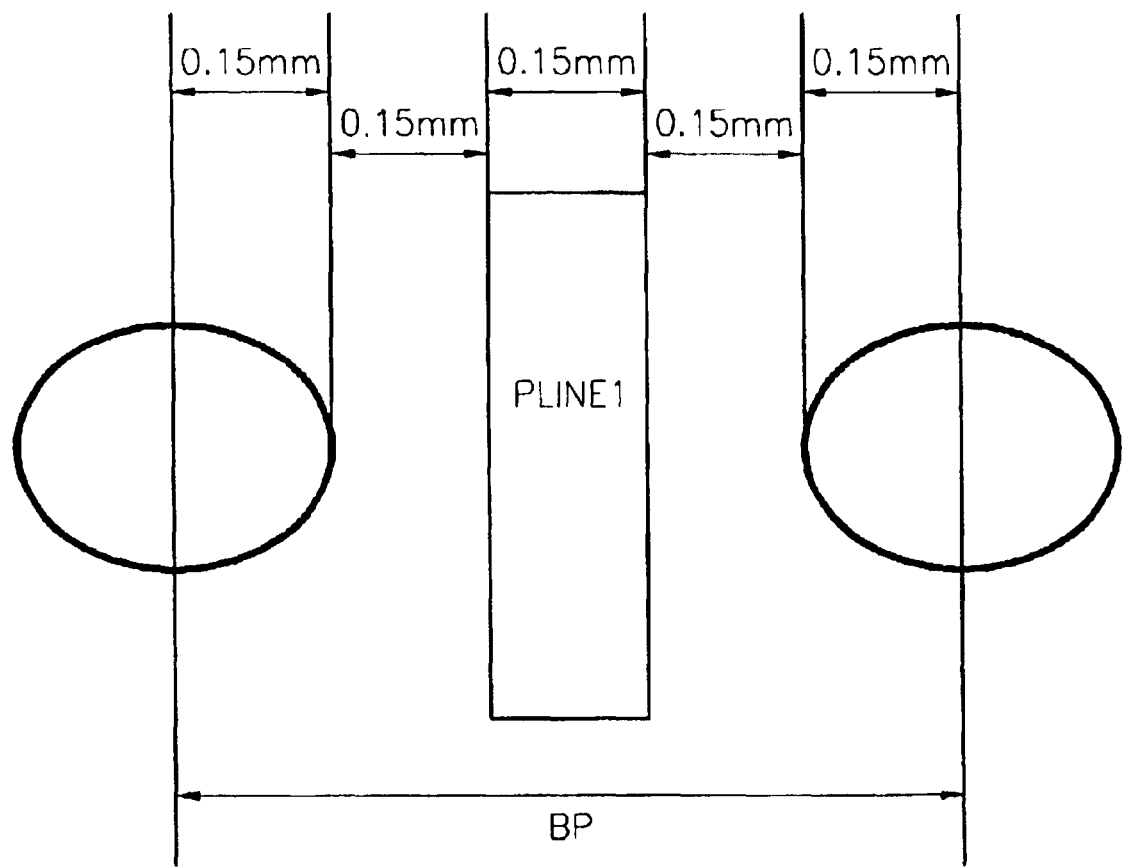
FIG. 3 is an enlarged view illustrating a portion of a socket contact unit of FIG. 2.
Figure 4:
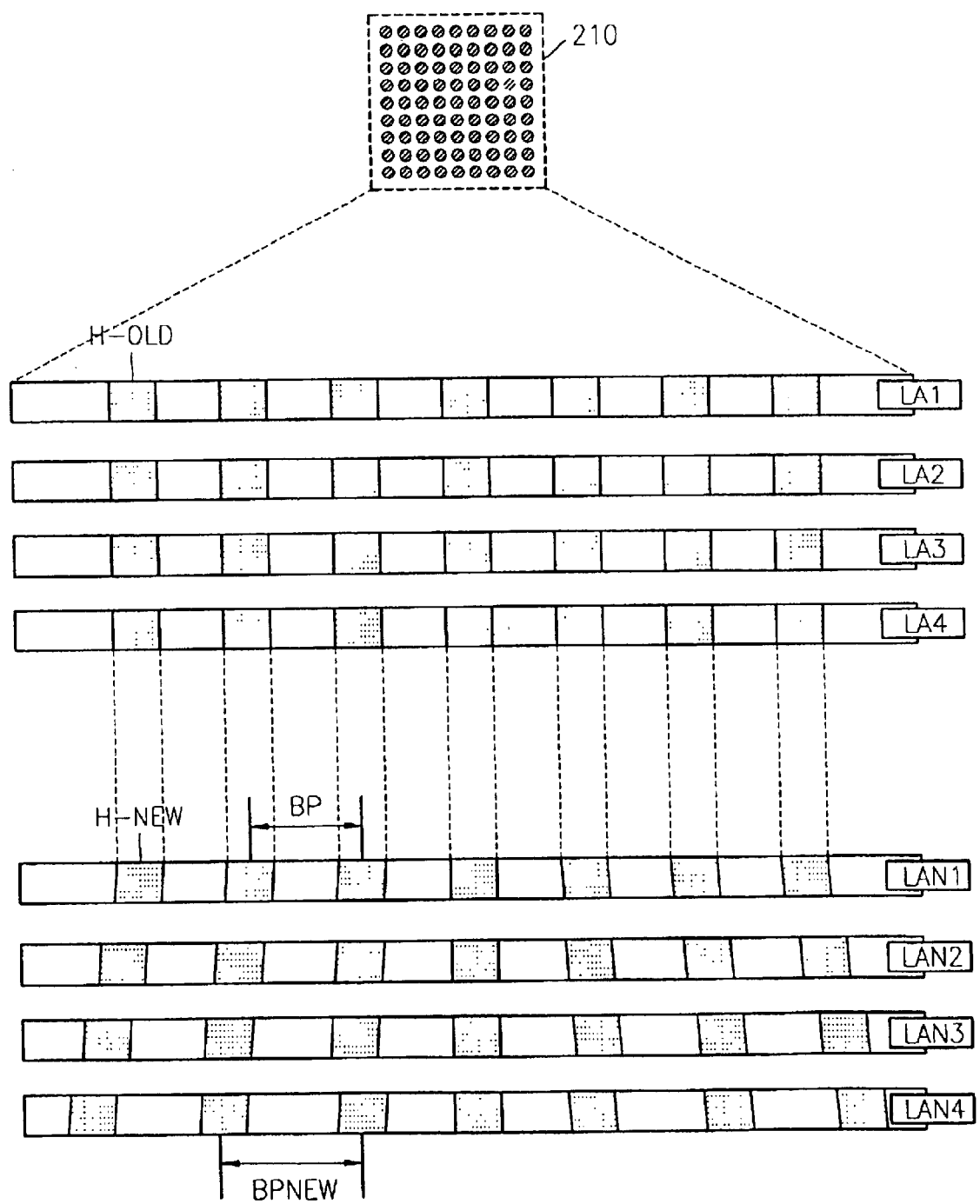
FIG. 4 is a side view of a socket contact unit of a semiconductor package test board according to an embodiment of the present invention.

FIG. 4 is a side view of a socket contact unit of a semiconductor package test board according to an embodiment of the present invention.

Referring to FIG. 4, a socket (not shown) having a semiconductor package is connected to the semiconductor package test board according to the preferred embodiment of the present invention, which includes a socket contact unit 210 made of a plurality of joined layers LAN1, LAN2, LAN3, and LAN4. The pitch between holes H-NEW, to which pins of the socket are connected, increases from the upper surface to the lower surface of the socket contact unit 210.

In this case, the semiconductor package is a fine ball grid array (FBGA) having a fine ball pitch. The socket contact unit 210 can be formed of a plurality of joined layers, but four layers LAN1, LAN2, LAN3, and LAN4 are shown in the preferred embodiment.

Holes H-OLD are perpendicularly formed on conventional layers LA1, LA2, LA3, and LA4. However, in the preferred embodiment, the holes H-NEW on the layers LAN1, LAN2, LAN3, and LAN4 diverge from the upper to the lower surface of the socket contact unit 210, at a predetermined angle. Accordingly, the ball pitch BP on the top layer LAN1 is different from the ball pitch BPNEW on the bottom layer LAN4, allowing the socket to be mounted directly on the test board regardless of the fine ball pitch.

To describe the method in detail referring to FIG. 4, the first through fourth layers LAN1, LAN2, LAN3, and LAN4 are joined to form the socket contact unit 210, then the holes H-NEW are formed. In forming the holes H-NEW, the holes H-NEW are inclined toward the edges of the socket contact unit 210. In this case, the angle of inclination of the holes H-NEW increases from the center of the socket contact unit 210 to the edge of the socket contact unit 210. However, there is a predetermined limit to the inclination. Accordingly, the holes H-NEW are formed to incline toward the edges of the layers LAN1, LAN2, LAN3, and LAN4. In this case, the holes H-NEW at the center of the layers become references, and the holes H-NEW diverge from the center to the edges of the layers LAN1, LAN2, LAN3, and LAN4. After forming the holes H-NEW, the holes H-NEW are filled with a conductor.

Figure 5:
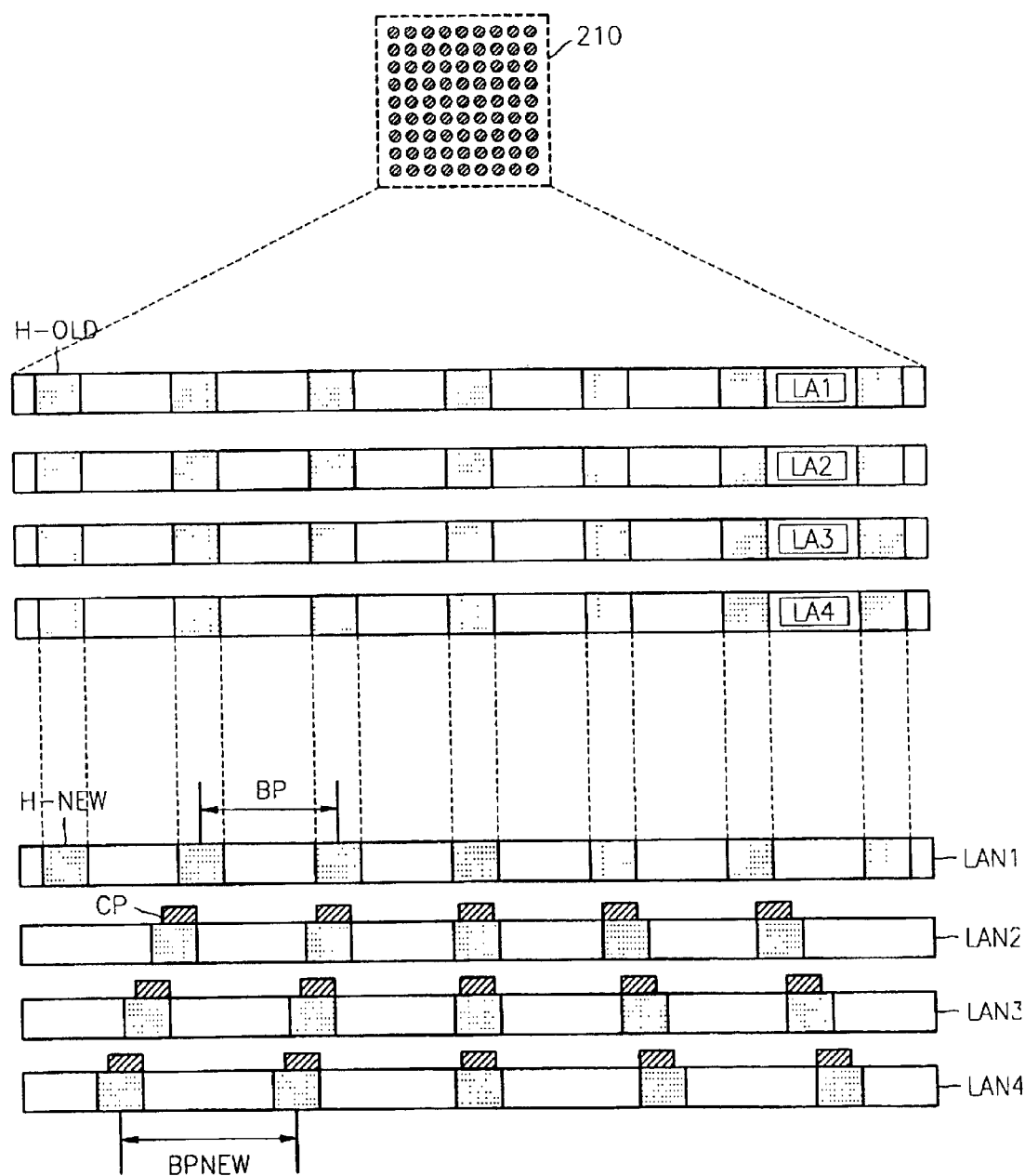
FIG. 5 is a side view of a socket contact unit of a semiconductor package test board according to a second embodiment of the present invention.

FIG. 5 is a side view of a socket contact unit of a semiconductor package test board according to a second embodiment of the present invention.

A socket contact unit 210 can be formed of a plurality of joined layers, but a socket contact unit 210 formed of four layers LAN1, LAN2, LAN3, and LAN4 is shown in the preferred second embodiment. The semiconductor package in the second embodiment is an FBGA.

Referring to FIG. 5, a socket (not shown) having a semiconductor package is connected to the semiconductor package test board according to the second embodiment of the present invention, which includes the socket contact unit 210 formed of a plurality of joined layers LAN1, LAN2, LAN3, and LAN4. The pitch of holes H-NEW to which pins of the socket are connected increases from the upper surface to the lower surface of the socket contact unit 210. On the upper surfaces of the holes H-NEW of the layers LAN2, LAN3, and LAN4 but not the top layer LAN1, contact patterns CP are formed to partly overlap with the holes H-NEW on the layer above.

In a conventional method, layers LA1, LA2, LA3, and LA4 are joined and the layers are penetrated to form holes H-OLD. Then, the holes H-OLD are filled with a conductor. In the second embodiment of the present invention, the holes H-NEW are formed beforehand on the layers LAN1, LAN2, LAN3, and LAN4. In the preferred embodiment of the present invention, the holes are formed at an angle after joining the layers. However, in the second embodiment, the holes H-NEW are formed before joining the layers LAN1, LAN2, LAN3, and LAN4. In addition, the holes H-NEW are formed perpendicular to each layer as shown in FIG. 5. The holes H-NEW are formed so that the ball pitch BP on the second layer LAN2 is larger than the ball pitch BP on the first layer LAN1, and the ball pitch BP on the fourth layer LAN4 is larger than the ball pitch BP on the third layer LAN3. The contact patterns CP formed of the conductor are formed on the holes H-NEW of the second through fourth layers LAN2, LAN3, and LAN4. Accordingly, the holes H-NEW on the second through fourth layers LAN2, LAN3, and LAN4 overlap the holes H-NEW on the upper layers LAN1, LAN2, and LAN3, respectively. Therefore, the holes on the upper and lower layers contact stably to smoothly transfer electric signals.

In the second embodiment shown in FIG. 5, the holes are formed perpendicular to each layer so that the holes can be conveniently formed. In addition, the ball pitch BPNEW on the bottom layer can be large by adjusting the number of layers.

In the semiconductor package test board according to the present invention, the holes are formed so that the ball pitch increases from the top layer to the bottom layer. As a result, the socket having the semiconductor package can be directly mounted on the test board without additionally mounting the sub test board (the socket board). In addition, the holes are formed perpendicular to each layer of the socket contact unit, to connect the holes to those on the layer above by using the conductor. As a result, problems such as deterioration of characteristics caused by contact error can be solved.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A semiconductor package test board, comprising:
   a socket contact unit formed of a plurality of layers, to which a socket having the semiconductor package is connected, wherein:
   the pitch between holes to which pins of the socket are connected increases from the upper surface to the lower surface in the socket contact unit, and
   the holes in the socket contact unit are inclined toward the edges of the socket contact unit.

2. The semiconductor package test board of claim 1, wherein the angle of inclination of the holes increases from the center of the socket contact unit to the edges of the socket contact unit.

3. The semiconductor package test board of claim 1, wherein the socket contact unit has the holes filled with a conductor.

4. The semiconductor package test board of claim 1, wherein the semiconductor package is a fine ball grid array (FBGA).

5. A semiconductor package test board, comprising:
   a socket contact unit formed of first through nth joined layers, to which a socket having the semiconductor package is connected, wherein:
   the pitch between holes to which pins of the socket are connected increases from the first to the nth layers, and
   the first through nth layers have holes inclined toward the edges of the layers.

6. The semiconductor package test board of claim 5, wherein the angle of inclination of the holes increases from the center of the layers to the edges of the layers.

7. The semiconductor package test board of claim 5, wherein the holes in the first through nth layers are filled with a conductor.

8. The semiconductor package test board of claim 5, wherein the semiconductor package is an FBGA.

* * * * *